United States Patent [19]
Weber

[11] Patent Number: 5,877,649
[45] Date of Patent: Mar. 2, 1999

[54] CIRCUIT ARRANGEMENT FOR SETTING THE OPERATING POINT

[75] Inventor: Stephan Weber, Munich, Germany

[73] Assignee: Siemens Aktiengesellschaft, Munich, Germany

[21] Appl. No.: 889,851

[22] Filed: Jul. 8, 1997

[30] Foreign Application Priority Data

Jul. 23, 1996 [DE] Germany .................. 196 29 769.9

[51] Int. Cl.⁶ ........................................ H03K 17/60
[52] U.S. Cl. ................................. 327/478; 327/65
[58] Field of Search ............................ 327/52, 63, 65, 327/72, 77–81, 89, 90, 112, 389, 391, 405, 427, 432, 434, 437, 478, 562, 563

[56] References Cited

U.S. PATENT DOCUMENTS 3,869,623  3/1975  Minner ................................. 327/405
5,319,251  6/1994  Gotz .................................... 327/14
5,463,308  10/1995  Vorenkamp et al. ................. 327/562

FOREIGN PATENT DOCUMENTS 38 11 949 A1  10/1989  Germany .

*Primary Examiner*—My-Trang Nu Ton
*Attorney, Agent, or Firm*—Hill & Simpson

[57] ABSTRACT

A circuit arrangement for setting the operating point of at least one signal transistor (2) driven by alternating signals (1), with a current source (3) that is coupled to a supply potential (8) and to the control input of the signal transistor (2). A regulating transistor (4) has a load path coupled to a reference potential (9) and to the control input of the signal transistor (2). A resistor (5) is connected to the control input of the regulating transistor (4) and to the setting input of the signal transistor (2). A capacitor (6) is connected between the control input of the regulating transistor (4) and the reference potential (9).

6 Claims, 1 Drawing Sheet

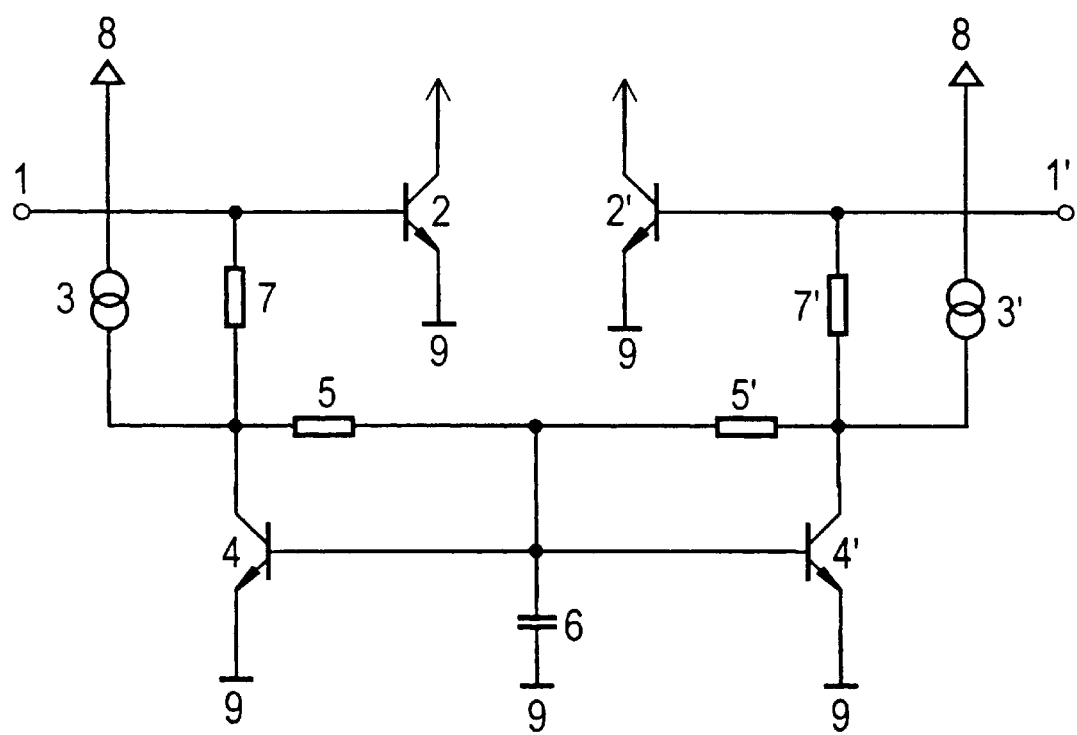

CIRCUIT ARRANGEMENT FOR SETTING THE OPERATING POINT

BACKGROUND OF THE INVENTION

The present invention is directed to a circuit arrangement for setting the operating point of at least one signal transistor driven by alternating signals.

Prior art, German reference DE 38 11 949 A1 discloses a circuit arrangement wherein narrow-band power amplifiers operate in the high-frequency range. The operating point of the transistors employed should be as optimally set as possible in order to obtain high efficiency and good harmonic behavior of these amplifiers. Over and above this, low signal energy should be consumed for setting the operating point for the purpose of a higher efficiency and the setting should be largely unit-independent.

An inductance or, respectively, a λ/4 line is usually utilized for decoupling the setting of the operating point from the useful signal. Given partial or complete integration of the amplifier circuit, either additional terminals at the respective, integrated circuit or, additional chip area is required. Given push-pull amplifiers, two identical operating point settings are undertaken, whereby the space requirement practically doubles compared to the single-ended embodiment because of two inductances or, respectively, λ/4 lines.

SUMMARY OF THE INVENTION

It is an object of the present invention to provide a circuit arrangement for setting the operating point of at least one signal transistor driven by alternating signals that does not exhibit these disadvantages.

In the inventive circuit arrangement, the setting of the operating point of a signal transistor driven by alternating signals ensues with a current source that, is coupled to a supply potential and to the control input (for example the base) of the signal transistor with a regulating transistor. The load path of the regulating transistor (for example the emitter-collector path thereof) is coupled, to a reference potential and to the control input of the signal transistor, with a resistor that is connected to the control input (for example, the base) of the regulating transistor and to the setting input of the signal transistor. The current source is connected to a capacitor that is connected between the control input of the regulating transistor and the reference potential. The signal transistor is a transistor contained, for example, in an amplifier stage via which a signal to be processed, (for example, a signal to be amplified) is conducted. The operating point thereof is set, among other things with the regulating transistor. Bipolar transistors are preferably employed as transistors in the high-frequency range. However, MOS transistors can also be correspondingly employed in the same way corresponding to the respective application. It is particularly advantageous that the capacitor that is easy to integrate is employed in addition to resistors and transistors, this capacitor being dimensioned relatively small compared to λ/4 lines and therefore making use of less chip area.

Given a push-pull embodiment, a further signal transistor is provided whose operating point setting ensues with a further current source that, is coupled to the supply potential and to the control input of the further signal transistor. A further regulating transistor has load path coupled to a reference potential and to the control input of the further signal transistor. A further resistor is connected to the control input of the further regulating transistor and to the setting input of the further regulating transistor. The control input of the further regulating transistor is connected to the control input of the regulating transistor. Advantageously, no further capacitor is required given a differential signal management, so that the chip area is only slightly increased due to the additional resistors and transistors.

In another embodiment the coupling resistor is connected between the control input of the signal transistor and the junction of current source, resistor and regulating transistor. In yet another embodiment a further coupling resistor is connected between the control input of the further signal transistor and the junction of further current source, further resistor and further regulating transistor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, and in which:

The single FIGURE is a circuit diagram depicting the present invention.

DESCRIPTION OF THE PREFERRED EMBODIMENTS

As depicted in the single FIGURE two signal resistors 2, 2' that, for example, are part of an amplifier circuit for higher frequencies are provided in the exemplary embodiment. The collectors of the two transistors 2 and 2' consequently lead to further circuit parts that, however, are not shown in the single FIGURE. Their emitters are directly connected to a reference potential 9. However, they could also be coupled to the reference potential 9 in the same way via other circuit elements such as, for example, resistors. The drive of the transistors 2 and 2' ensues with a differential signal that is formed by two signals 1 and 1' inverse relative to one another. The basis of the transistors 2 and 2', further, are connected via a respective coupling resistor 7 or, respectively, 7' to a respective junction that, among other things, is wired to the collector of a respective npn transistor 4 or, respectively 4'. The collectors of the transistors 4 and 4' are coupled via a respective current source 3 or, respectively, 3' to a supply potential 8 and are also coupled via a respective resistor 5 or, respectively, 5' to the interconnected basis of the transistors 4 and 4'. The interconnected bases of the transistors 4 and 4' are connected via a capacitor 6 to the reference potential 9 to which the emitters of the transistors 4 and 4' are also connected.

In differential circuits such as, for example, push-pull amplifiers, the difference between the setting of the operating point of the direct current and the signal processing is comprised not only in the frequency but also in that the useful signal is a matter of a push-pull signal and the setting of the operating point is to be viewed as being a common-mode signal. The inventive circuit arrangement enables a DC feed without coil or, respectively, λ/4 lines given push-pull circuits. The advantages of an inductive solution such as low signal losses are thereby largely preserved; however, only a fraction of the area is required given an integrated embodiment. Given a symmetrical embodiment, the circuit junctions at the basis of the regulating transistors 4 and 4', that is, their control inputs, are not driven due to the push-pull drive with the useful signal, since the capacitor 6 generates a virtual zero point at the control inputs of the transistors 4 and 4' for alternating signals. As a result thereof, the transistors 4 and 4' are not driven by alternating signals and therefore act as current sources. Consequently, they do not influence the signal path at the basis, that is, at the control inputs of the transistors 2 and 2'. Given direct currents, by contrast, the circuit acts like two independent current mirrors, as a result whereof a far-reaching degree of independence from unit scatter can be realized.

So that parasitic properties such as, for example, transistor capacitances, have optimally little influence, the resistors 5 and 5' can be formed by a plurality of individual resistors connected in series. Likewise, the finite current amplification can be largely compensated in that additional base resistors are connected into the base line of the regulating transistors 4 and 4'. Over and above this, the emitter area relationship can be selected unequal to zero as in the case of any other current mirror. Finally, the capacitor 6 can be dimensioned such that the effect of the single-ended feedback is already canceled at low frequencies. This, for example, can be advantageous at very high signal frequencies since the transistors no longer behave ideally here.

In conclusion, let it be pointed out that, in addition to the symmetrical embodiment shown as exemplary embodiment, an asymmetrical embodiment is possible in the same way. The circuits elements 1' through 7' are merely to be removed therefor in the present exemplary embodiment.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement for setting an operating point of at least one signal transistor driven by alternating signals, comprising:

a signal transistor having first and second electrodes connected to a load path of the signal transistor, the signal transistor also having a control input, the load path thereby forming an output;

a current source coupled to a supply potential and to the control input of the signal transistor;

a regulating transistor having a load path coupled to a reference potential and to the control input of the signal transistor;

a first resistor feeding back a control input of the regulating transistor to the local path of the regulating transistor;

a second resistor connected between the control input of the signal transistor and the load path of the regulating transistor; and a capacitor connected between the control input of the regulating transistor and the reference potential.

2. The circuit arrangement according to claim 1, wherein the circuit arrangement further comprises:

a further signal transistor driven by inverse alternating signals, the further signal transistor having first and second electrodes connected to a load path of the further signal transistor;

a further current source coupled to the supply potential and to the control input of the further signal transistor;

a further regulating transistor having a load path coupled to the reference potential and to the control input of the further signal transistor;

a further resistor connected to the control input of the further regulating transistor and to the control input of the further signal transistor;

the control input of the further regulating transistor connected to the control input of the regulating transistor.

3. The circuit arrangement according to claim 2, wherein the circuit arrangement further comprises a further coupling resistor is connected between the control input of the further signal transistor and a junction of the further current source, the further resistor and the further regulating transistor.

4. A circuit arrangement for setting an operating point of a first signal transistor driven by alternating signals and a second signal transistor driven by inverse alternating signals, comprising:

said first and second signal transistors, each having first and second electrodes connected to a load path thereof;

a first current source coupled to a supply potential and to the control input of the first signal transistor;

a first regulating transistor having a load path coupled to a reference potential and to the control input of the first signal transistor;

a first resistor connected to a control input of the first regulating transistor and to the control input of the first signal transistor;

a second current source coupled to the supply potential and to a control input of the second signal transistor;

a second regulating transistor having a load path coupled to the reference potential and to the control input of the second signal transistor;

a second resistor connected to the control input of the second regulating transistor and to the control input of the second signal transistor, the control input of the second regulating transistor being connected to the control input of the first regulating transistor;

a capacitor connected between the control inputs of the first and second regulating transistors and the reference potential.

5. The circuit arrangement according to claim 4, further comprises a first coupling resistor is connected between the control input of the first signal transistor and a junction of the first current source, the first resistor and the first regulating transistor, and a second coupling resistor is connected between the control input of the second signal transistor and a junction of the second current source, the second resistor and the second regulating transistor.

6. A circuit arrangement for setting an operating point of a first signal transistor driven by alternating signals and a second signal transistor driven by inverse alternating signals, comprising:

said first and second signal transistors, each having first and second electrodes connected to a load path thereof;

a first current source coupled to a supply potential and to the control input of the first signal transistor;

a first regulating transistor having a load path coupled to a reference potential and to the control input of the first signal transistor;

a first resistor connected to a control input of the first regulating transistor and to the control input of the first signal transistor;

a second current source coupled to the supply potential and to a control input of the second signal transistor;

a second regulating transistor having a load path coupled to the reference potential and to the control input of the second signal transistor;

a second resistor connected to the control input of the second regulating transistor and to the control input of the second signal transistor, the control input of the second regulating transistor being connected to the control input of the first regulating transistor;

a capacitor connected between the control inputs of the first and second regulating transistors and the reference potential;

a first coupling resistor connected between the control input of the first signal transistor and a junction of the first current source, the first resistor and the first regulating transistor; and a second coupling resistor connected between the control input of the second signal transistor and a junction of the second current source, the second resistor and the second regulating transistor.

\* \* \* \* \*